United States Patent [19]
Levi

[11] Patent Number: 5,657,267
[45] Date of Patent: Aug. 12, 1997

[54] DYNAMIC RAM (RANDOM ACCESS MEMORY) WITH SEU (SINGLE EVENT UPSET) DETECTION

[75] Inventor: Mark W. Levi, Utica, N.Y.

[73] Assignee: The United States of America as represented by the Secretary of the Air Force, Washington, D.C.

[21] Appl. No.: 540,604

[22] Filed: Oct. 5, 1995

Related U.S. Application Data

[63] Continuation-in-part of Ser. No. 265,463, Jun. 17, 1994, Pat. No. 5,526,305.

[51] Int. Cl.⁶ ................................................. G11C 11/24
[52] U.S. Cl. ................................................. 365/149; 257/297
[58] Field of Search ................................. 365/149, 174, 365/178, 150; 257/297, 296

[56] References Cited

U.S. PATENT DOCUMENTS

| | | | |
|---|---|---|---|
| 3,634,825 | 1/1972 | Levi | 365/149 |
| 3,706,079 | 12/1972 | Vadasz | 365/150 |

*Primary Examiner*—A. Zarabian
*Attorney, Agent, or Firm*—William G. Auton; Harold L. Burstyn; George E. Kersey

[57] ABSTRACT

Individual cells in a memory array are structured and interconnected to permit detection and identification of the locations of errors known as Single Event Upsets (SEUs), with the correction and identification of an affected cell made using only a single parity bit for a group of cells in a memory array, eliminating the necessity for reading an entire memory in order to detect SEUs immediately, and eliminate large numbers of non-useful correction-code cells in order to increase the net useful density of cells in a memory and tolerate a larger rate of SEU events than for previous methods, additionally eliminate the need for purification of packaging materials for memory arrays by removing most radioactive materials and providing a further economic benefit by eliminating the need for organic coatings, which can cause reliability hazards, and to block alpha particles originating in packaging.

14 Claims, 5 Drawing Sheets

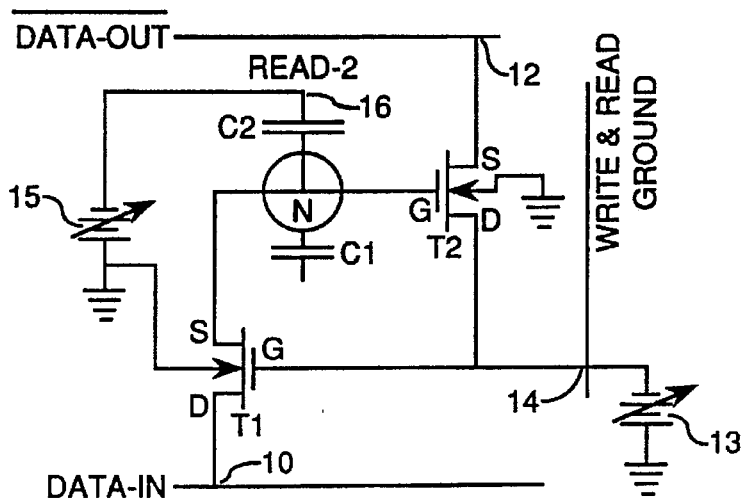
FIG. 1
PRIOR ART
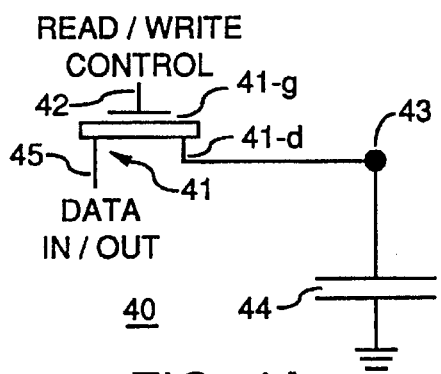
FIG. 4A
PRIOR ART
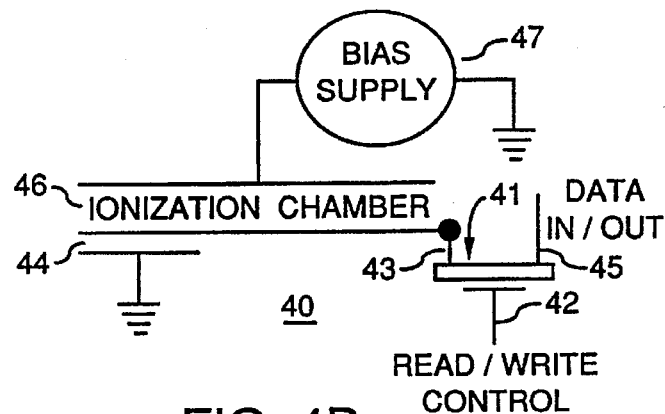
FIG. 4B
FIG. 5

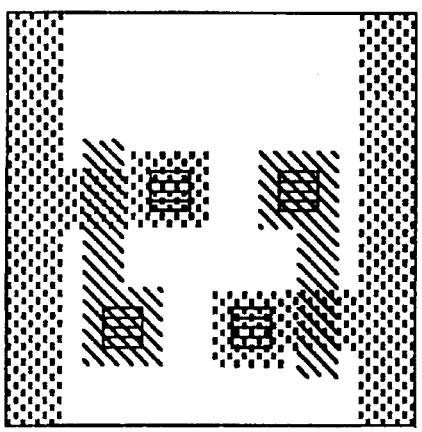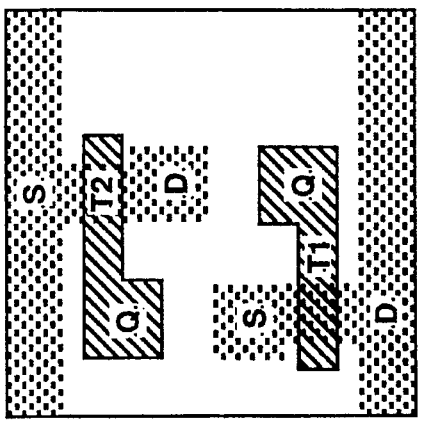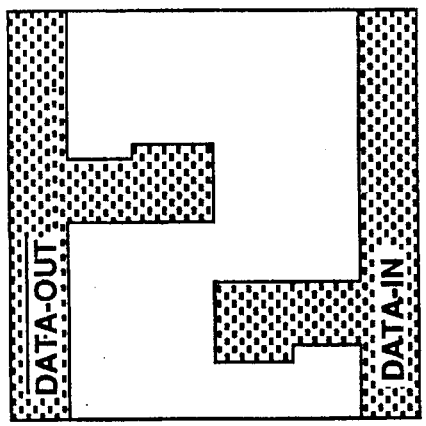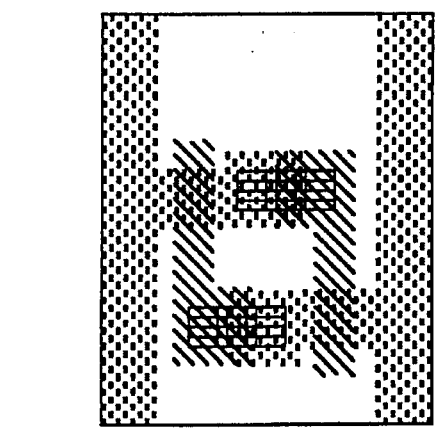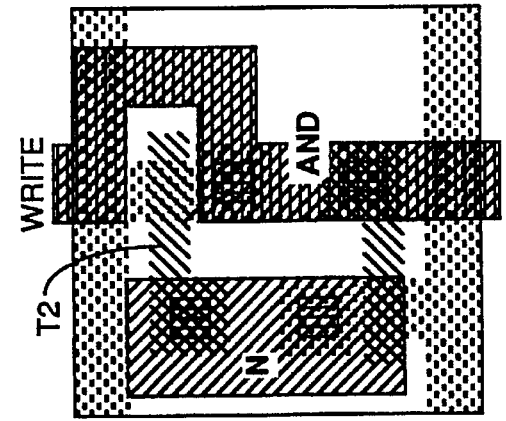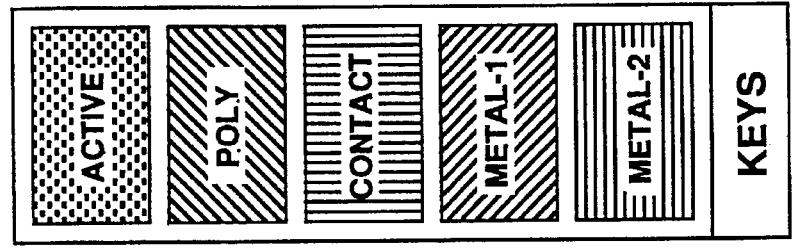

DYNAMIC RAM (RANDOM ACCESS MEMORY) WITH SEU (SINGLE EVENT UPSET) DETECTION

CROSS-REFERENCE TO RELATED APPLICATION

This application is a continuation-in-part of application Ser. No. 08/265,463 filed on 17 Jun. 1994 U.S. Pat. No. 5,526,305 issued, the disclosure of which is incorporated herein by reference.

STATEMENT OF GOVERNMENT INTEREST

The invention described herein may be manufactured and used by or for the Government for governmental purposes without the payment of any royalty thereon.

BACKGROUND

This invention relates generally to semiconductors, and more particularly, to semiconductor circuitry implementation and operation for Dynamic Random Access Memory (DRAM) cells, which improve over the above-identified Application by permitting more compact cellular arrays and immediate detection of a Single Event Upset (SEU) in order to eliminate the need for elaborate error detection and correction schemes.

In a dynamic memory, the presence or absence of an electrical charge on a storage element, such as a capacitor, can represent either of two binary states. The dynamic memory is randomly accessible if it can be interrogated without requiring sequential addressing.

My prior U.S. Pat. Nos. 3,513,365 and 3,634,825 disclose Dynamic Random Access Memory (DRAM) cells in which two transistors are used as crosspoints for non-destructive readout, or as an associative memory using two cells per stored bit (binary digit). My pending application Ser. No. 08/265,463 reduced the number of access lines per cell to improve cell packing density.

However, these prior efforts do not solve the problems created by the universal presence of ionizing particles, such as alpha particles from radioactive contamination of packaging materials or cosmic radiation. Such particles destroy the information stored in a memory cell by creating temporary ionized tracks which uncontrollably charge or discharge a memory cell.

Events which obliterate the information stored in a memory cell are designated as Single Event Upsets (SEUs). To partially deal with this problem, data have been stored in groups of cells with error detection and correction capability, thus requiring extra storage capacity. As a result there is a reduction in effective cell packing density. There also is the requirement of elaborate systems for sweeping the memory to detect SEUs and make correction before there have been so many occurrences that correction cannot take place.

Various systems have been provided for dealing with SEUs in DRAM cells. These systems are disclosed in the following U.S. patents, which are incorporated herein by reference: U.S. Pat. No. 4,360,900 issued to Bate; U.S. Pat. No. 4,494,217 issued to Suzuki et al.; U.S. Pat. No. 4,891,684 issued to Nishioka et al.; and U.S. Pat. No. 4,937,650 issued to Shinriki et al.

Bate discloses using high dielectric constant insulators, such as those provided by zirconium oxide, hafnium oxide and tantalum oxide. High dielectric constant insulators are used in place of customary silicon oxide as part of the gate dielectric in field-effect transistors.

Suzuki et al. use an alpha shield of resinous material to protect semiconductor memories against "soft errors". This shields against alpha particles from packaging materials containing trace amounts of uranium or thorium.

In Shinriki et al., an insulating film is formed beneath a film of high dielectric-constant tantalum oxide to provide a large-capacity semiconductor capacitor for increased reliability.

Nishioka et al. disclose a semiconductor device with a reaction-preventing film between a capacitor insulator of tantalum oxide and an upper electrode to prevent a reaction between the electrode and the insulator.

The above-cited references approach error prevention by shielding, which cannot be effective for cosmic rays, or by increasing storage capacity with high dielectric constants or very thin insulators. This procedure becomes ineffective as geometries are reduced and, in any event, only reduces the likelihood of error occurrences without providing for their identification or correction.

It is an object of the invention to detect error producing "single event upset" events (SEUs).

Another object of the invention is to provide a dynamic random access memory with the capability for immediately indicating both when and where a single event upset has occurred.

SUMMARY OF THE INVENTION

In accomplishing the foregoing and related objects, the present invention improves upon on my pending application Ser. No. 08/265,463. At the expense of a moderate increase in size, each individual cell in a memory array can be made to detect and identify the location of a Single Event Upset (SEU).

As a result, identification of an affected cell in a memory array group can be made, and the cell corrected, using only a single parity bit for the group. Reading an entire memory is no longer needed for detecting SEUs, and the elimination of large numbers of non-useful correction-code cells increases the net useful density of cells in the memory. Since immediate indication of an SEU is obtained, a much larger rate of SEU events can be tolerated than for previous methods, and packaging materials used for memory arrays need not be purified to eliminate most radioactive materials. This provides a further economic benefit and permits the elimination of organic coatings to block alpha particles originating in packaging. Such organic coatings can cause other reliability hazards.

Each cell in an array has a write & read-ground terminal, and a read-2 terminal to which changes in driving voltage are applied to perform reading. The write & read-ground terminal is placed to avoid covering any part of the cellular node at which charge is carried to represent information stored in the cell. The potential of each cellular read-2 terminal, which covers the node, is kept at values that cause the insulator or dielectric of the capacitor from the node to the read-2 terminal to act always as a guard ionization chamber.

The change of charge of a struck node is dominated by the charge from the guard ionization chamber, causing the cell to be overwhelmingly conducting at all times, even when not being read. Even when being read, the cell is more strongly conducting than it otherwise would be. This gives an immediate indication of both the occurrence and location of the affected cell.

Operation of the cells and their arrays is substantially the same as described in my referenced application, unless an SEU occurs. In that event, a correction of corrupted data is made using the parity of a group of cells associated with the affected cell and the identity of the affected cell.

In accordance with another aspect of the invention, a memory cell with at least one input/output terminal includes at least one semiconductor device connected to a node and operative to become conducting for the reading of stored information signals. A plurality of semiconductor devices, such as field-effect transistors, can joined at the node and operatively connected between input and output terminals to become conducting for the reading of stored information signals.

A storage device extending from the node forms a guard ionization chamber so that any change of charge caused by an ionizing particle striking the node can cause the cell to become conducting whether or not being read, i.e. charge collection by the node is so strongly dominated by charge collected from the ionization chamber that a potential will be left on the node causing the cell to be in its conduction reading condition even when not being read.

The ionizing particle can create a hot-track of electron-hole pairs in the storage device, altering a stored information signal when the particle enters the storage device, which can include a dielectric extending from the node and disposed so that an ionizing particle entering the dielectric creates electron-hole pairs along a trajectory extending to the node.

When the memory cell is for the storage of dynamic random access information signals, the storage device can be a capacitor that extends to the node, semiconductor devices of the cell are joined to a "read-ground" terminal, and an ungrounded "read" terminal can form a capacitor plate that is at least partially enveloped by the read-ground terminal. Alternatively, an ungrounded read terminal can completely cover that portion of the node extending to one of the semiconductor devices.

The read-ground terminal can be spaced from the node that extends from one of the semiconductor devices. In a memory cell of the invention, an input terminal can receive data-in signals, and an output terminal can provide data-out. Semiconductor devices provided by field-effect transistors can be joined by a "write & read-ground" terminal. Each field-effect transistor has a gate electrode and source/drain electrodes. The gate electrode of one transistor is connected to a source/drain electrode of another transistor and to the write & read-ground terminal. A source/drain electrode of the one transistor is connected to a data-in terminal, and its other source/drain electrode is connected to a gate electrode of the other transistor to form an electrical node having capacitance extending to the read-2 terminal. A source/drain electrode of the other transistor also is connected to the data-out terminal.

Capacitance extending to a cell node is disposed such that every substantially straight line passing through the node contains a segment lying entirely within the capacitance, with one end of the segment at the node and the other end at a read-2 terminal. An ionizing particle traversing the segment within the capacitance will create substantially more electron-hole pairs along that segment than will be created by a particle traversing any other portion of the straight line from which charge is collectable by the node.

A two-transistor dynamic random access memory cell of the invention can be driven by adjustable voltage sources, with one voltage output having a level that if applied directly to the node, the voltage would cause one of the transistors to become conducting. The other voltage source can be adjusted to cause the other transistor to become conductive between its source and drain electrodes, so that any information signal on the data-in terminal charges the capacitance at the node and keeps the one transistor non-conducting, with the other voltage then being changed to make the other transistor non-conducting, and maintain the node at the data-in level. The one transistor then can function as a source, but remain non-conducting, unless an ionizing particle strikes the node. The one source can be adjusted to determine whether an ionizing particle has struck the node after an information signal has been stored, by causing the node to acquire a voltage which renders the one transistor conducting. Thereafter, the other voltage is changed to induce an additional voltage upon the node so that the one transistor permits confirming the information signal stored on the node by conducting only if the stored voltage is of a relatively high magnitude, but is otherwise non-conducting. Subsequently the one driving voltage is changed so that the voltage upon the node returns to its prior value and the one transistor is non-conducting.

Information on the data-out terminal resulting from reading a stored logical "1" can be represented by a voltage corresponding to an input logical "0", and the reading of a stored logical "0" can be represented by a voltage corresponding to an input logical "1".

The data-in and data-out terminals can be positioned in spaced parallel relationship in the cell, with transistors disposed between the terminals to provide a compact integrated structure.

A plurality of integrated dynamic random-access memory cells can be arranged as a topologically linear array, with the data-out terminals of all cells but one being also the data-in terminal of an adjacent cell in the array, so that the symmetry of connections, in conjunction with the parallel relationship of the data-in and data-out terminals, provides compactness for each cell of the array.

The cells can be arranged as a rectangular array with N columns and M rows, with a read-2 terminal of each cell in a column being connected and driven by one voltage-driving source, and the write & read-ground terminals of each cell in the column being connected and driven by another voltage-driving source, so that each cell in a column, except the Mth, has its data-output terminal in common with the data-input terminal of an adjacent cell. The cells of each row in the array have their data-in terminals in common to form a data input terminal for the row, and their data-out terminals in common to form a data output terminal for the row. The rectangular array can have a special column of cells, with the input terminal of the cell in each row of the special column connected in common with the output terminals of the remaining row cells, and the output terminal of the cell in each row of the special column connected in common with the input terminals of the remaining cells of the row in the array.

A column of "upside-down" cells can be arranged with the input and output terminals of the cell in each row of the column respectively connected in common with the output and input terminals of the remaining cells in the row of the array, so that the information in an ordinary column of cells of the array is accessed by reading the column and writing inverted and shifted data into the upside-down cells, which can take place simultaneously with or be followed by reading the upside-down cells and writing the re-inverted, original and shifted data back into the ordinary column of the array.

A plurality of dynamic random-access memory cells can be arranged as a topologically rectangular array with a number N of columns, and a number M of rows. Terminals of the cells in a column are connected together and driven by sources for the column. As a result, each cell in a column, except the Mth, has its data-output terminal in common with the data-input terminal of an adjacent cell in that column, the cells of each row in the array have their data-in terminals in common to form a data input terminal for the row, the cells of each row have their data-out terminals in common to form a data output terminal for the row, information is stored in the array in groups for which a parity bit is included in each group, and each cell of a group is physically separated from every other cell of that group sufficiently to prevent a single ionizing particle from affecting more than one cell of the group. Parity of the group, combined with other information, is used to reconstruct and rewrite the information voltage originally stored on such struck node.

In a method of operating a dynamic random access memory cell formed by two transistors connected to a storage node, the steps include (a) producing respective voltage-driving outputs, with one output having a level that if applied directly to the storage node would cause one of transistors to become conducting; (b) adjusting another voltage-driving output to cause the other transistor to become conductive, causing any data-in signal to store charge at said node and keep the one transistor non-conducting; (c) changing the voltage-driving output to make the other transistor non-conducting and maintain the node at its data-in level, whereby the one transistor can function as a source, but remains non-conducting unless an ionizing particle strikes the node; (d) adjusting the one voltage-driving output to determine whether an ionizing particle has struck the node after an information signal has been stored, by causing the node to acquire a voltage which renders the one transistor conducting; (e) thereafter, changing the one voltage driving output to induce an additional voltage upon the node so that the one transistor permits the determination of the information signal stored on the node by conducting only if the stored voltage is of a relatively high magnitude, but is otherwise non-conducting; and (f) subsequently changing the one voltage-driving output so that the voltage upon the node returns to its prior value and the one transistor is non-conducting.

In accordance with a further feature of the invention, a dynamic random access memory has semiconductor devices connected for storing and receiving information and connected at a node to a storage capacitor, which is charged through one of the semiconductor devices which is thereafter rendered nonconductive; and an additional voltage is induced upon the node through the capacitor.

The foregoing and other features and advantages of the invention will become more readily apparent from the following detailed description, taken in conjunction with the accompanying drawings in which like elements are given like reference numerals.

DESCRIPTION OF THE DRAWINGS

FIG. 1 is an electrical schematic diagram of integrated circuit elements employed both in my above-cited application and also in my present invention;

Figure 2C:
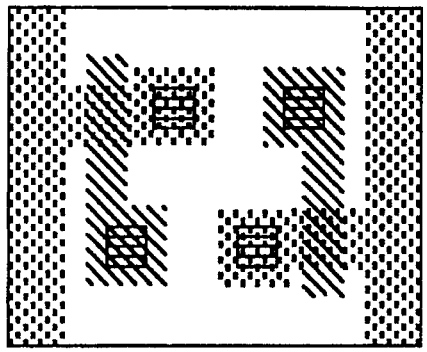
FIGS. 2A-2F, is a sequential layout showing construction steps, in accordance with the "keys" portion of FIG. 2, for implementing the integration of circuit elements of FIG. 1 in my prior application.
Figure 2F:
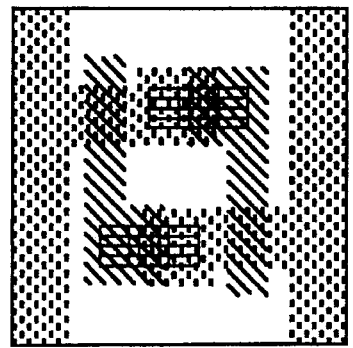
Figure 2B:
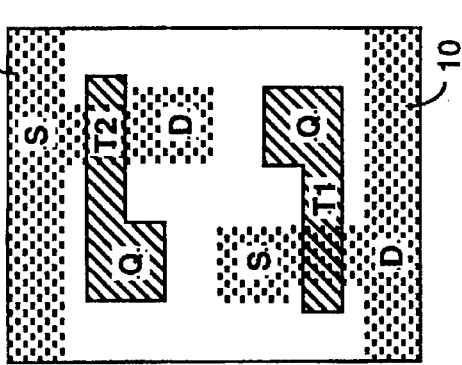
Figure 2E:
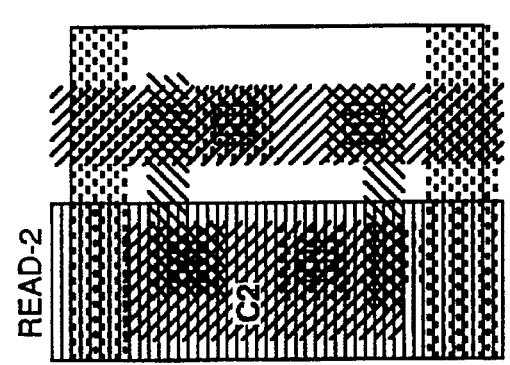
Figure 2A:
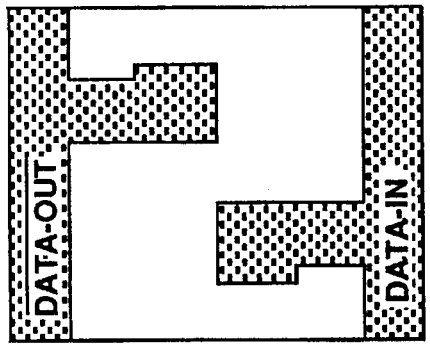
Figure 2D:
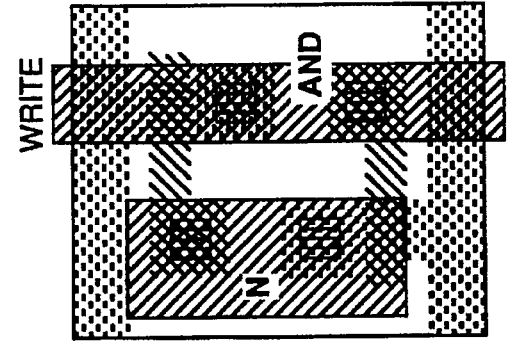
Figure 2:
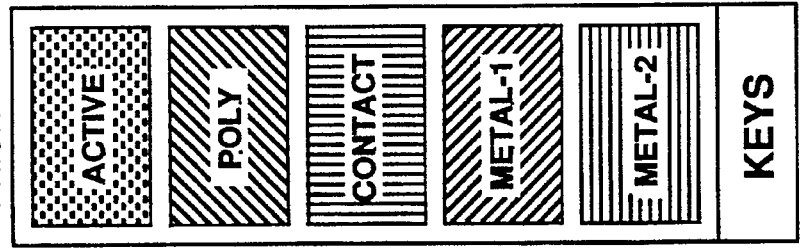
FIG. 2, with parts A-F forming

The "keys" in FIG. 2, ranging from top to bottom, indicate "active" areas having only very thin layers of oxide and "poly" layers of polysilicon which are both implanted with impurities to form transistor Gate, Source and Drain electrodes; "contact" areas cut from an overlying layer of insulation (not shown); "metal-1" areas that form a nodal contact and a write & (and) read-ground terminal; and a "metal-2" layer that forms a read-2 terminal;

FIG. 2', with parts A'-F' forming FIGS. 2A'-2F', is a sequential layout showing the modifications necessary in my prior invention to realize my present invention in the layout of cells.

Figure 3:
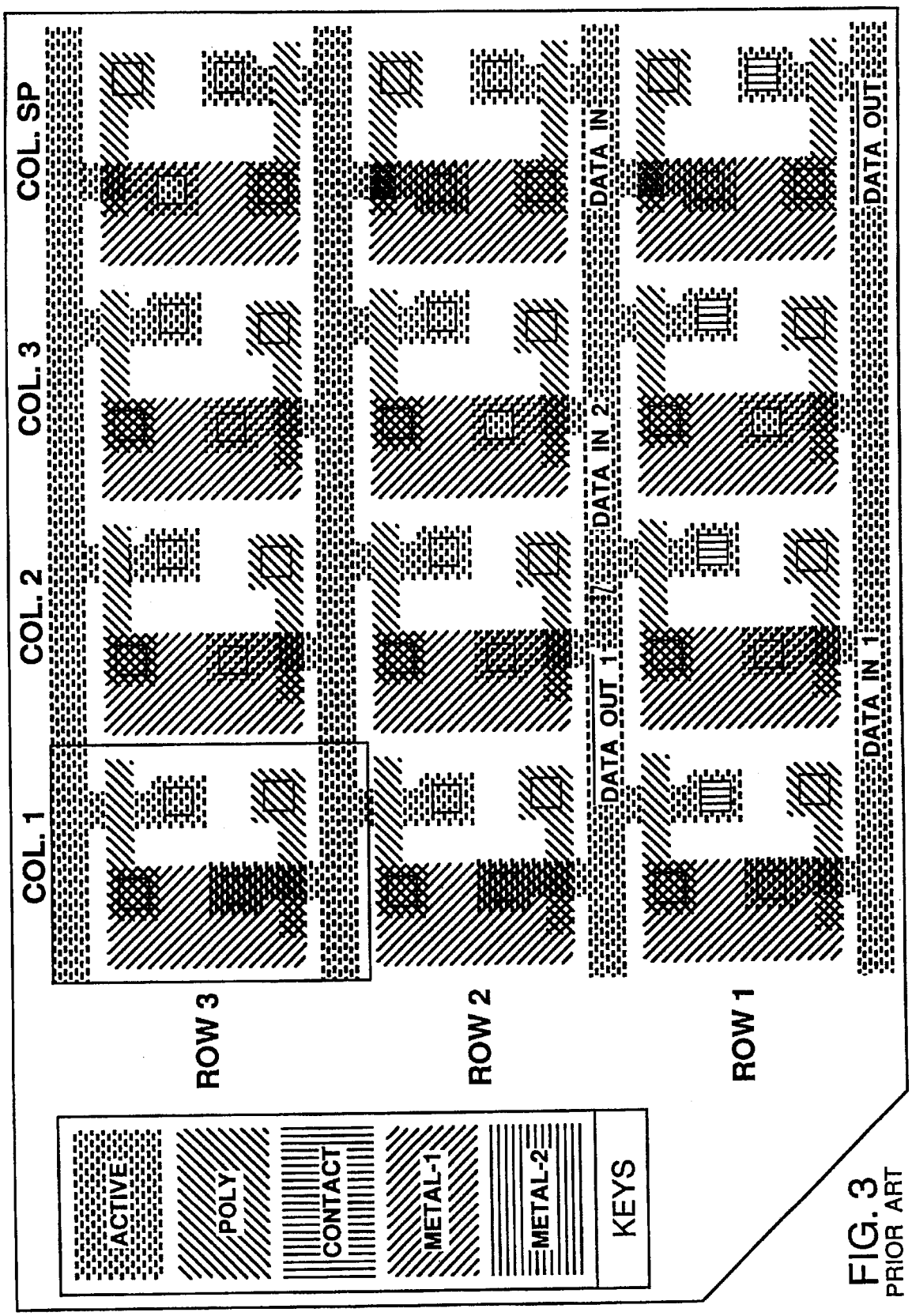
Figure 3:
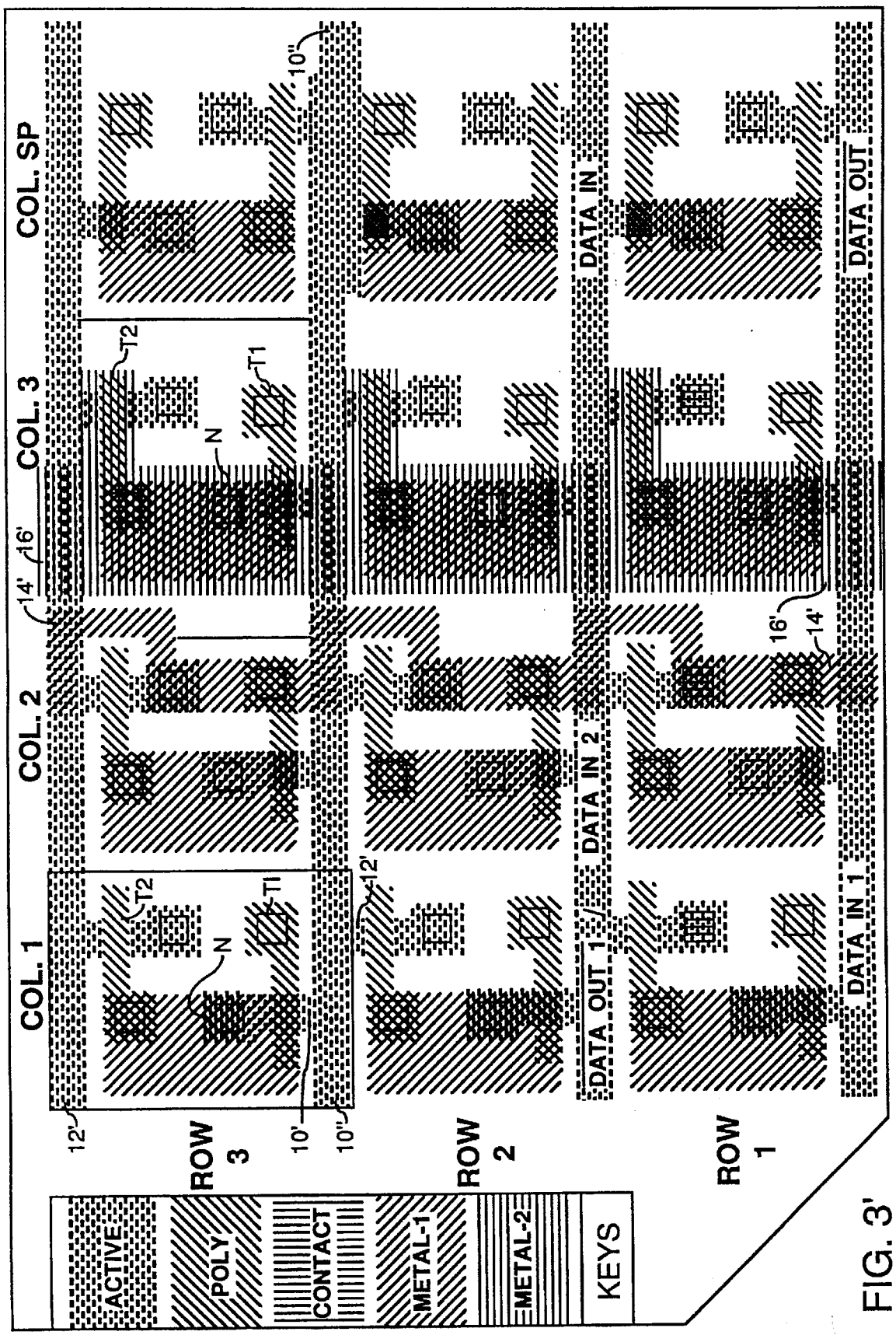

The changes in FIG. 2', with respect to FIG. 2, include a cell widening to accommodate re-routing of the write & read-ground terminal to avoid passing over any part of the node N, particularly the gate of transistor T2, and an alteration in the read-2 terminal to completely cover all of the node N. Not shown in FIG. 2' is the thickness or material composition of the "featureless" insulating layer which isolates the read-2 terminal from the node. The insulating layer is "featureless" in that it is not patterned within the cell. As compared to the corresponding insulating layer in FIG. 2, the insulating layer of FIG. 2' may be made relatively thick and/or of a composition which has a greater stopping power along the track of an ionizing particle passing through the insulating layer, and hence greater production of electron-hole pairs per unit length of travel;

FIG. 3 is a layout of an array of cells from my referenced application. For clarity the metal-2 layer is not shown, nor is the write/read-ground portion of the metal-1 layer;

FIG. 3' is a corresponding layout of an array of cells of my present invention. Again, for clarity, the metal-2 layer is shown only in column 3, and the metal-1 layer is complete only in column 2.

FIG. 4A is a single-transistor memory cell of the prior art which can be modified as shown in FIG. 4B to include a guard ionization chamber in accordance with the invention; and FIG. 5 is a cross-sectional diagram illustrating the trajectories of an ionizing particle which can give rise to a single error upset that is curable in accordance with the invention.

DETAILED DESCRIPTION OF PREFERRED EMBODIMENTS (a) The Circuit Components

With reference to the drawings, FIG. 1 is an electrical schematic that applies to both the invention of my prior application, as well as to my present invention in which the integration of circuit components is modified to realize the advantages of my present invention. The adjustable driving batteries shown in FIG. 1 are not part of the cell of the invention, but represent peripheral components needed for driving terminals of the cell and sensing some cell conditions. For simplicity, not shown are sensor/drivers for the data-input and data-output terminals which serve multiple functions for the cells due to merging of the input terminal of one cell with the output terminal of an adjacent cell in an array of cells. Such sensor/drivers are well known by those of ordinary skill in the art of dynamic memory design.

In addition, FIG. 1 represents an improvement over the cells disclosed in my prior U.S. Pat. No. 3,515,365, realized by separating my earlier data-in/data-out terminal into individual data-in and data-out terminals, and by making the write terminal of the prior art common to the prior read-1 terminal.

This might appear disadvantageous by requiring two data terminals for each cell in a column of cells sharing a common read-2 terminal and a common write & read-ground terminal. However, the data-in terminal of one row of cells is merged with the data-out terminal of an adjacent row of cells, so that only one extra data terminal is required for an entire array of cells.

In essence, there is no material increase in the number of required terminals. Further, the resulting increased internal symmetry of the cell, combined with elimination along a column of previously required isolation space between cells, as well as the elimination of a separate write connection, actually permits a smaller area layout than prior art systems using a single data-in/data-out terminal, and separate read and write terminals.

The cell of FIG. 1 permits dynamic random access memory storage of an information signal, and uses a data-in terminal 10 to receive the information signal, such as a voltage representing either a logical "1" or a logical "0". When reading takes place, an inverted output voltage representing a logical "0" or "1" is produced on a data-out terminal 12.

The cell of FIG. 1 includes two memory transistors T1 and T2, each having a gate electrode G, a source electrode S and a drain electrode D. In practice, the source and drain electrodes are interchangeable and are sometimes designated as source/drain (S/D) electrodes.

In order to store and read the information signal on the data-in terminal 10, producing an inverted output on the data-out terminal 12, at least first and second adjustable voltage driving sources 13 and 15 provide respective first and second voltage driving signals at terminals 14 and 16.

The gate terminal G of transistor T1 is connected to the drain electrode of the transistor T2, and to the first voltage driving source 13. The source terminal S of the transistor T2 is connected to the data-out terminal 12. The drain electrode D of transistor T1 is connected to the data-in terminal 12, while the source electrode S of transistor T1 is connected to the gate electrode G of transistor T2, forming an electrical node N.

The node N is one plate of a capacitor C2, the other plate being connected to the second driving source 15, and is also one plate of distributed capacitance C1 between the node N and the remainder of its surroundings.

In operation, the first driving voltage source 13 is adjusted to make the first transistor T1 conductive between its source and drain electrodes S/D, causing any information data signal on the data-in terminal 10 to be placed on the node N by causing the capacitor C1 and the capacitance C2 to be charged to the level of the voltage on the data-in terminal 10. This voltage at the node N is of a magnitude to make the transistor T2 non-conductive.

The voltage of the first driving source 13 is then changed to make the first transistor T1 non-conductive, and the first source/drain of the second transistor T2 function as a source electrode at a voltage corresponding to an output logical zero. This effectively traps the voltage on the node N at the level of the voltage corresponding to a logical "0" (low voltage) or "1" (higher voltage) on the data-in terminal 10. As a result the data-in voltage is capacitively stored at the node N, and in either case the transistor T2 does not conduct. In preparation for reading from the cell, a voltage and charge are applied to the data-out terminal.

Subsequently, the second-driving voltage of the source 15 is changed to provide an additional voltage at the node N by way of the capacitor C2, so that the second transistor T2 conducts, corresponding to a logical output "0", only if the voltage of the stored information represents a logical "1".

Conversely, the second transistor T2 will not conduct, corresponding to a logical output "1", if the voltage of the capacitively stored information represents a logical "0". As a result, the voltage of the data-out terminal 12 is set to a logical complement of the stored information.

Thereafter, the driving voltage of the second source 15 is changed in a "second-changing" to return the voltage at the node N to its value prior to the "first-changing" in the second driving voltage, and the second transistor T2 becomes non-conductive.

(b) The Prior Art Cell Integration of FIG. 1

A partial prior art layout of a single cell in accordance with FIG. 1, which is included in an array of many of such cells, is shown in FIGS. 2A through 2E. The layout is of the relevant layers of the cell. Using the terminology and rules for a MOSIS (Metal-Oxide-Semiconductor-Integrated-System) layout, the following is shown with reference to the column of "keys" to the right of the column containing FIGS. 2C and 2F:

In FIG. 2A the shaded portions are "active" areas, parts of which form the data-out line 12 of FIG. 1, the data-in line 10 and the source/drain conductors (S and D) of transistors T1 and T2. Active areas not subsequently masked by polysilicon ("poly") become source/drain conductors as indicated in FIG. 2B;

FIG. 2C shows four "contact" holes cut from an overlying layer of oxide. The holes are to permit gate (G) and drain (D) connections to the transistor T2, and source (S) and gate (G) connections to the transistor T1.

In FIG. 2D a patterned first metal layer ("metal-1") connects the source (S) of transistor T1 to the gate (G) of transistor T2, and provides most of the underlying plate of capacitor C2 connected to the Node N. A further part of the first metal layer ("metal-1") connects the drain (D) of transistor T2 to the gate (G) of transistor T1, while simultaneously providing a write &(and) read-ground terminal that is used, as explained below, for interconnecting a column of cells.

In FIG. 2E there is a second metal layer ("metal-2") that is applied only after the creation of overlying insulation layer (not shown) that forms the dielectric of capacitor C2. The second metal layer ("metal-2") forms the "read-2" connector shown in FIG. 1 and is separated from the other layers by the insulating dielectric forming the capacitor C2. The read-2 terminal is also used for interconnecting the same column of cells that is interconnected by the write & read-ground terminal.

While FIGS. 2A–2E show a layout using MOSIS rules for a particular process and illustrate topological advantages, it will be appreciated that other process rules may also be used. The MOSIS rules are designed to make it possible for different semiconductor foundries, using different processes, to make the same part. The MOSIS rules constitute a least common denominator.

The final FIG. 2F, following FIG. 2E, illustrates how additional compaction of cell layout could be achieved by "breaking" the MOSIS layout rule which requires minimum spacing between an active contact and a polysilicon contact, thereby creating a different process.

(c) The Adaptability of FIG. 2 for Array Integration

As seen in FIG. 2B, the similarity of the two transistors T1 and T2 in each cell is apparent. The data-in terminal 10 is parallel to the data-out terminal 12, and is in a physical position to supply a data-in signal to the next cell in an array of cells. In each cell, the data-in terminal 10 is actually the data-out terminal 12 of an adjacent cell. With a column of such cells, it will be apparent that only one additional terminal is used for the whole column, and with the transistor similarity, much space is saved in each cell, and in the overall array. This separation of inputs from outputs simplifies the operation of a memory array by simplifying the peripheral circuitry required for restoring information currently in a column when only a portion of the information in the column is to be rewritten, while the remainder is retained. An inversion is always required to obtain amplification. Consequently, two inversions are required to obtain non-inverted amplification.

Since the cell inverts, only one additional inversion is required for restoration. In fact, a column of upside down cells, each as shown in FIG. 1, can be used to perform this function. If the first cell in a column of cells accepts information on data terminal 10, and is read at data terminal 12, then the remaining column of upside down cells will restore the information. The upside down cells accept information from data terminal 12 of the first cell. This is read to a final data terminal 10 of the first cell. The information will be restored if it is written to the first cell from inverted data remaining after a read of the upside-down cell. The only requirement is that the output voltages of upside-down cell are suitable data input voltages for the first cell.

(d) The Cell Integration of FIG. 1 by the Invention

FIG. 2' shows the layout modifications of FIG. 2 necessary to achieve invention. By comparison with FIG. 2, the cell substrates of FIG. 2' are widened. Otherwise FIGS. 2A' through 2C' correspond to FIGS. 2A through 2C, and are governed by the same kinds of "keys".

The widening of the space occupied by a cell on its substrate is made to accommodate rerouting of the write &(and) read-ground line to avoid passing over the gate of transistor T2, as shown in FIG. 2D'. In addition, as shown in FIG. 2E' an alteration is made in the read-2 terminal to extend over the gate of the transistor T2 and cover all of the node N. There is a dielectric layer (not shown) which covers the entire cell and is applied after the metal-1 layer in FIG. 2D', and before the metal-2 layer in FIG. 2E'. Consequently the dielectric layer is "featureless" by not being patterned within the cell. The thickness and composition of the insulating dielectric layer, which isolates the read-2 terminal from the node N, are proportioned to insure that any trajectory of any ionizing particle traversing the dielectric and intersecting the node N will give rise to such substantial creation of hole-electron pairs that no other portion of the trajectory from which the node might collect charge can compete with the charge which will be collected from the dielectric layer.

Compared to the corresponding dielectric layer (not shown) applied in FIG. 2 between the processes of FIGS. 2D and 2E, the dielectric layer of the invention may be made relatively thick and/or of a composition with a greater stopping power and therefore greater production of electron-hole pairs per unit length over the track of an ionizing particle passing into the dielectric layer. The suitable oxide of FIG. 2 may be replaced by zirconium oxide, hafnium oxide or tantalum oxide in order to achieve the effect of the invention with a reduced thickness of dielectric. Multiple films may be employed.

(e) The Prior Art Array Integration of FIG. 1

FIG. 3 shows a topologically rectangular array of three columns and three rows of cells, and an additional "special" column of inverted (or upside-down) cells for which the data-in and data-out terminals in a row are, respectively, the data-out and data-in terminals of the other cells of the same row. The cell of row 3, column 1 is outlined showing the merging of the data-out terminal of row 2 with the data-terminal of row 3.

The array features are independent of the particular process. For clarity, only portions of some layers are shown.

(f) The Array Integration of the Invention for FIG. 1

FIG. 3' is a layout corresponding to FIG. 3 of an array of cells modified in accordance with the present invention. Again, for simplification and clarity, the metal-2 layer is shown only in column 3, and the metal-1 layer 16' is complete only in column 2. Thus the system of FIG. 1 is provided with guard detection and an ionizing particle passing through the dielectric of the capacitor C2 and through capacitor C1 creates a third level of charge (higher than a logical "1") of the information stored as charge on the node N, so high as to cause the transistor T2 to conduct. In such cases, a "parity" bit can be employed subsequently to correct the error. Parity is a comparative odd-even relationship among bits (binary integers).

As with FIG. 3, the cell of row 3, column 1, i.e. cell/31, is outlined showing the merging of the data-out terminal of row 2 with the data-in terminal 10' of row 3, to form the composite terminal 10". A similar terminals 10" is formed by the merger of data-out 1 and data-in 2 between rows 1 and 2.

In operation the dynamic random access memory cell array of FIG. 3' has separate first and second voltage driving source/detectors (not shown) connected to each write & read-ground and read-2 line, such as the lines 14' (column 2) and 16' (column 3) for producing respective first and second voltage-driving outputs. Every second voltage-driving output always has a level that if applied directly (e.g. in column 3) to a node N of any cell/33 would cause the second transistor T2 of that cell to become strongly conducting, thus properly biasing dielectric of C2 of each cell to function as an ionization chamber. One of the first voltage-driving sources, such as that at line 14' is then adjusted to cause the first transistors T1 of a column to become conductive between their source and drain electrodes. This causes the information signals on the data-in terminals to charge the capacitances at the nodes N of the column and keep the second transistors T2 non-conducting, with the voltage of that same voltage-driving source, such as that at line 14', then being changed to make those first transistors T1 non-conducting and maintain the nodes N at the data-in level. During this process the remaining first voltage sources would remain at a voltage which maintains the transistors T1 of the cells of their respective columns in an non-conducting state.

As a result, every second transistor T2 remains non-conducting unless an ionizing particle strikes a node N. In preparation for reading from the array, voltage and charge are applied to each data out line and the transistor T2 of any struck cell will conduct between its data out line and its write & read-ground line. And the sensors on those lines will immediately be activated, thereby identifying the struck cell. Thereafter, whenever no cell has been struck by an ionizing particle, the second voltage driving output, such as that at line 16', is changed to induce an additional voltage upon the nodes N of a column so that the second transistor T2 permits discerning the information signal stored on the node N by conducting only if the stored voltage is of a relatively high magnitude. Otherwise the second transistors T2 are non-conducting.

Subsequently the same second driving voltage is changed so that the voltages upon the nodes N return to their prior values, and all second transistors T2 are again non-conducting.

In each dynamic random access memory cell, discerned information on the data-out terminal, resulting from reading a stored logical "1", may be represented by a voltage corresponding to an input logical "0". The reading of a stored logical "0" may be represented by a voltage corresponding to an input logical "1".

The data-in and data-out terminals 10' and 14' of the individual cells are positioned in spaced parallel relationship, and the transistors T1 and T2 are disposed between the terminals 10' and 14' to provide a compact integrated structure.

In the overall structure of FIG. 3' a plurality of integrated dynamic random-access memory cells are arranged as a topologically rectangular array. The data-out terminal of all but one row is also the data-in terminal of an adjacent row in the array. As a result, the symmetry of the connections in conjunction with the parallel relationship of the data-in and data-out terminals provides improved compactness for each cell of the array.

As can be seen in FIG. 3', a plurality of dynamic random-access memory cells are arranged as a rectangular array with N columns and M rows.

In addition, a special column (COL SP) of cells, such as cells/3SP–1SP, is arranged with the input terminal of the cell in each row of the special column connected in common with the output terminals of the remaining cells in that row of the array (e.g. cells/31–33 are connected to cell/3SP) and its output terminal is connected in common with the input terminals of the remaining cells of that row of the array. As a result the cells in the special column are "upside-down". This allows the information in an ordinary column of cells of the array to be accessed by reading the data in the ordinary column of the array, and writing the information (in the form of voltages which are the inverted and shifted data) into the upside-down or special column. The outputs of the upside down column can then write re-inverted (original) shifted data back into any ordinary column of the array.

In operation of a plurality of dynamic random-access memory cells arranged as a topologically rectangular array with a number N of columns, and a number M of rows, connected as shown in FIG. 3', the interconnected read-2 terminals of a column are each driven by a separate second voltage-driving source, and the interconnected write & read-ground terminals of each cell in a column are each driven by a first voltage-driving source for the column. Each cell in a column as shown in FIG. 3', except the Mth, has its data-output terminal in common with the data-input terminal of an adjacent cell in that column.

Information can be stored in the array in groups for which a parity bit is included in each group, and each cell of a group is physically separated from every other cell of that group sufficiently to prevent a single ionizing particle from affecting more than one cell of the group. Consequently, reconstruction and rewriting of the information voltage originally stored on a struck node of any cell is accomplished by combining the parity of the group to which it belongs with information as to which cell of the group has had its node struck by the ionizing particle, and the information which can be read from the remainder of the cells of the group.

In a method of the invention for operating a dynamic random access memory cell formed by first and second transistors connected to a storage node, the steps include producing respective first and second voltage-driving outputs, with the second voltage-driving output having a level that if applied directly to the storage node of the cell would cause the second transistor to become conducting; adjusting the first voltage-driving output to cause the first transistor to become conductive causing any data-in information signal to store charge at the node and keep the second transistor non-conducting; changing the first voltage-driving output to make the first transistor non-conducting and maintain the node at its data-in level, so that the second source/drain of the second transistor can function as a source terminal but the transistor remains non-conducting unless an ionizing particle strikes the node; applying a voltage and determining whether an ionizing particle has struck the node causing the second transistor to conduct, between its output terminal and its write & read-ground terminal, charging the output terminal preparatory to reading the cell; thereafter, whenever no cell has been struck by an ionizing particle, changing the second voltage driving output to induce an additional voltage upon the node so that the second transistor permits the discernment of the information signal stored on the node by conducting only if the stored voltage is of a relatively high magnitude, but is otherwise non-conducting; and subsequently changing the second driving-voltage output so that the voltage upon the node returns to its prior value and the second transistor is non-conducting, and again applying voltage and charge to the output terminal preparatory to reading.

(g) Single Transistor embodiment of the Invention

With reference to FIG. 4A a single-transistor memory cell 40 of the prior art is formed by a field-effect transistor 41 with its gate 41-g at a "read/write" control terminal 42 and its drain 41-d connected at a node 43 to a grounded data storage. capacitor 44. A data signal is written or read at a data "in/out" terminal 45. When a control voltage is applied to the terminal 42, a data signal passes through the transistor 41 to the node 43 and is stored on the capacitor 44. Conversely, for reading, a control signal is again applied to the terminal 42 and the voltage of the capacitor 44 is available from the node 43 as data out. It is apparent that if an ionizing particle strikes and penetrates the capacitor 44, it can create a trajectory with hole-electron pairs that will alter the voltage on the capacitor 44 with consequent error when an attempt is made to read the stored data, i.e. a "0" can be converted to a "1" and vice versa.

In order to provide for the detection of a Single Error Upset (SEU), the cell 40 of FIG. 4A is modified to take the form of the cell 40' of FIG. 4B by the incorporation of a guard ionization chamber 46 at the node 43. The chamber 46 is grounded through a bias supply 47. When an ionizing particle strikes the node 43, which extends to cover the entire upper plate of the capacitor 44 (forming the lower plate of the chamber 46), hole-electron pairs are created which permit the bias supply to charge the capacitor 44 above the voltage associated with a stored data signal. Consequently application of a control signal at the control terminal 42 allows monitoring of the capacitor voltage, so that a detected voltage above the data level, caused by the operation of the chamber 46 and the bias 47 after a node strike, indicates a SEU. A sense amplifier (not shown) at the terminal 42 can be threshold responsive to distinguish data signals from errors. Upon detection of an error, the cell 40' is "refreshed" by clearing the cell and re-writing with either a "0" or "1", depending on the levels produced in the cell 40' by the bias supply 47 when there is a particle strike. Since, for example, a "0" can be a relatively low level voltage, and a "1" a relatively higher level, the enhanced signal level for a "1" will be higher than for a "0".

(h) Illustration of Trajectories Applicable to the Invention

Illustrative ionization trajectories for a particle striking a cell 50 of the invention are shown in FIG. 5, which is related to the field-effect transistor T1 of FIGS. 2B', 2D' and 2E'.

The transistor T1 is formed by N-doped material 51 separated from a P-doped substrate 52 by a depletion layer 53. The N-doped material 51 constitutes the source S of the transistor T1 and is in contact with a "metal-1" layer 54-1 (as indicated in FIG. 2'). The N-doped material 51 and the metal-1 layer 54-1 constitute the node 55, with the layer 54-1 forming the lower plate of the capacitive guard ionization chamber 54 (shown as capacitor C2 in FIG. 2E'). The upper plate of the chamber 54 is provided by the "metal-2" layer 54-2, which also serves as the "read-2" terminal of the cell 50. Between the upper terminal 54-2 and the lower terminal 54-1 is a dielectric layer 54-3.

Also included in FIG. 5 is an additional conducting layer 56 (not shown in FIG. 2') which covers the cell of FIG. 5 (and the entire array that includes the cell 50) and is spaced from the layer 54-2 by a dielectric 57. In effect the layer 56, the dielectric 57 and the layer 54-2 form an auxiliary guard chamber which is maintained at a suitable potential for ionization chamber effectiveness. Consequently, FIG. 5 shows a dual guard chamber similar to the capacitor 46 in FIG. 4B.

In FIG. 5 are shown two possible trajectories X and Y for an ionizing particle passing through the node 55. Each trajectory has segments from which charge can be collected by the node 55. For the trajectory X the segment A is within the guard chamber combination 54 and 56-57. The trajectory X extends to segment B in the undepleted "funnel" portion F of the semiconductor substrate 52. Similarly, the trajectory Y has a segment A' within the chamber 56 above the cell of the transistor T1. A segment B' extends into a funnel F' of the substrate 52. Charge can be collected by the node 55 from the segments A and A', as well as the segment B and B'.

The guard ionization chambers are constructed such that the charge collection from the chamber so strongly dominates the original charge on the node 55 that the cell of the transistor T1 will become conducting even when the cell is not being read by varying the voltage on the read-2 terminal 54-2. The thicker the layer 54, the more charge will be available for collection, and if the material of the layer 54 has greater "stopping power" (by creating more electron-hole pairs in the A and A' segments than in the B and B' segments, the greater will be the guard ionization effect.

Variations of the invention include the interchange of semiconductors, using P-channel transistors rather than N-channel and reversing the polarity of signals. The substrate can be non-planar, including a well. And various processes can be used for realizing the cell and array structures.

While the invention has been described in its presently preferred embodiments, it will be understood that the wording used is of description, rather than of limitation, and that changes may be made without departing from the broad scope and spirit of the invention.

What is claimed is:

1. A memory cell having a capacitive storage upon which at least one first charge may be stored;

said at least one first charge carrying information;

said information being retrievable from said node;

a guard ionization chamber one of whose electrodes is said node;

said ionization chamber being disposed so that any ionizing particle that strikes said node causes a second charge from said ionization chamber to be stored upon said node; and said second charge being distinguishable from said at least one first charge.

2. A memory cell as defined in claim 1, wherein the information that said second charge has been stored upon said node is immediately available to a plurality of detection means.

3. A plurality of memory cells as defined in claim 2 wherein the detection means are sufficient to identify which cell of said plurality of memory cells has been struck.

4. A plurality of memory cells as defined in claim 3 wherein information is stored in groups of memory cells such that no two memory cells of a group will have their nodes struck by the same ionizing particle and at least one cell of each group contains prearranged information about the information stored in the remaining memory cells of said group, whereby the information stored in any of said groups which contains a cell whose node has been struck by an ionizing particle or which contains a cell near a cell whose node has been struck may be reconstructed and rewritten using only the identity of the said struck cell and the information in said group or groups in combination with said prearranged information.

5. A memory cell as defined in claim 1 comprising:

(a) a data-in terminal, a data-out terminal, a write&read-ground terminal and a read-2 terminal a (b) a first and a second transistor, each having a gate electrode and first and second source/drain electrodes;

(c) the second source/drain electrode of said first transistor being connected to the gate electrode of said second transistor forming said node, said node having capacitance through dielectric material to said read-2 terminal thereby forming a capacitor, both said dielectric and said read-2 terminal covering said node;

(d) the gate electrode of the first transistor is connected to the first source/drain electrode of the second transistor and to said write&read-ground terminal such that every part of said gate said first source/drain or said write&read-ground terminal which covers a first part of said node is covered by a second part of said node;

(e) a controllable voltage applied to said read-2 terminal whereby said node, the read-2 terminal and said dielectric material function as said ionization chamber;

(f) the second source/drain terminal of the second transistor is connected to the data-out terminal, and the first source/drain electrode of said first transistor is connected to said data-in terminal; and (g) said cell is so operated that conductivity between the write&read-ground terminal of said memory cell and the data-out terminal of said memory cell is reduced or not present when the information in said cell is not being retrieved.

6. A memory cell as defined in claim 5 wherein extra conductivity between the write&read-ground terminal of said cell and the data-out terminal of said cell is present after the node of said cell has been struck and said extra conductivity persists, even though the information in said cell is not being retrieved, until further information charge is written onto the node of said cell, and means connected to said write&read-ground terminal and means connected to said data-out terminal for detection of said extra conductivity.

7. An array of memory cells as defined in claim 6 wherein the memory cells are arranged in rows and columns by connecting write&read-ground terminals to form columns and by connecting data-out terminals to form rows and such that each cell belongs to one and only one row and one and only one column whereby continuing extra conductivity between the write&read-ground terminals of a column and the data-out terminals of a row uniquely identifies which cell of said plurality has been struck, and for each row the data-in terminals of the cells in that row are connected in common, and for each column the read-2 terminals of the cells in that column are connected in common.

8. An array of memory cells as defined in claim 7 wherein the input terminals of each row of memory cells but one are in common with the output terminals of an adjacent row of memory cells.

9. An array of memory cells as defined in claim 7 wherein information is stored in groups of memory cells physically separated such that no two memory cells of a group will be struck by the same ionizing particle and at least one cell of each group contains prearranged information about the information stored in the remaining memory cells of said group, whereby the information stored in any of said groups which contains a cell whose node has been struck by an ionizing particle or which contains a cell adjacent to a cell whose node has been struck may be reconstructed and rewritten using only the identity of said struck cell and the remaining information in said group or groups in combination with said prearranged information.

10. An array of memory cells as defined in claim 8 wherein information is stored in groups of memory cells physically separated such that no two memory cells of a group will be struck by the same ionizing particle and at least one cell of each group contains prearranged information about the information stored in the remaining memory cells of said group, whereby the information stored in any of said groups which contains a cell whose node has been struck by an ionizing particle or which contains a cell adjacent to a cell whose node has been struck may be reconstructed and rewritten using only the identity of said struck cell and the remaining information in said group or groups in combination with said prearranged information.

11. A plurality of arrays as defined in claim 7 wherein information is stored in groups of memory cells physically separated such that no two memory cells of a group will be struck by the same ionizing particle and at least one cell of each group contains prearranged information about the information stored in the remaining memory cells of said group, whereby the information stored in any of said groups which contains a cell whose node has been struck by an ionizing particle or which contains a cell adjacent to a cell whose node has been struck may be reconstructed and rewritten using only the identity of said struck cell and the information in said group or groups in combination with said prearranged information.

12. A plurality of arrays as defined in claim 8 wherein information is stored in groups of memory cells physically separated such that no two memory cells of a group will be struck by the same ionizing particle and at least one cell of each group contains prearranged information about the information stored in the remaining memory cells of said group, whereby the information stored in any of said groups which contains a cell whose node has been struck by an ionizing particle or which contains a cell adjacent to a cell whose node has been struck may be reconstructed and rewritten using only the identity of said struck cell and the information in said group or groups in combination with said prearranged information.

13. A plurality of arrays as defined in claim 9 wherein information is stored in groups of memory cells physically separated such that no two memory cells of a group will be struck by the same ionizing particle and at least one cell of each group contains prearranged information about the information stored in the remaining memory cells of said group, whereby the information stored in any of said groups which contains a cell whose node has been struck by an ionizing particle or which contains a cell adjacent to a cell whose node has been struck may be reconstructed and rewritten using only the identity of said struck cell and the information in said group or groups in combination with said prearranged information.

14. A plurality of arrays as defined in claim 10 wherein information is stored in groups of memory cells physically separated such that no two memory cells of a group will be struck by the same ionizing particle and at least one cell of each group contains prearranged information about the information stored in the remaining memory cells of said group, whereby the information s tored in any of said groups which contains a cell whose node has been struck by an ionizing particle or which contains a cell adjacent to a cell whose node has been struck may be reconstructed and rewritten using only the identity of said struck cell and the information in said group or groups in combination with said prearranged information.

* * * * *